United States Patent
Brown et al.

(10) Patent No.: US 10,648,612 B2
(45) Date of Patent: May 12, 2020

(54) MOUNT ASSEMBLY

(71) Applicants: Christopher W. Brown, Marshfield, MO (US); Kristina J. Brown, Marshfield, MO (US)

(72) Inventors: Christopher W. Brown, Marshfield, MO (US); Kristina J. Brown, Marshfield, MO (US)

( * ) Notice: Subject to any disclaimer, the term of this patent is extended or adjusted under 35 U.S.C. 154(b) by 31 days.

(21) Appl. No.: 16/025,421

(22) Filed: Jul. 2, 2018

(65) Prior Publication Data
US 2020/0003361 A1    Jan. 2, 2020

(51) Int. Cl.
| | |
|---|---|
| *F16M 13/00* | (2006.01) |
| *F16M 11/04* | (2006.01) |
| *A45F 5/00* | (2006.01) |
| *A47B 96/06* | (2006.01) |
| *A47G 29/00* | (2006.01) |
| *F16M 13/02* | (2006.01) |
| *H05K 5/02* | (2006.01) |
| *F16B 17/00* | (2006.01) |
| *A47G 23/02* | (2006.01) |
| *B65F 1/14* | (2006.01) |

(52) U.S. Cl.
CPC ........... *F16M 13/022* (2013.01); *F16B 17/00* (2013.01); *H05K 5/0204* (2013.01); *A45F 5/00* (2013.01); *A47B 96/061* (2013.01); *A47G 23/0225* (2013.01); *B65F 1/14* (2013.01); *F16M 11/041* (2013.01)

(58) Field of Classification Search
CPC ..... F16M 13/022; F16M 11/041; F16B 17/00; H05K 5/0204; A45F 5/00; A47G 23/0225; A47B 96/061; B65F 1/14
See application file for complete search history.

(56) References Cited

U.S. PATENT DOCUMENTS

| | | | |
|---|---|---|---|
| 4,320,885 A | 3/1982 | Kawazoe | |
| 4,915,343 A | 4/1990 | Terlecke | |
| 5,850,954 A * | 12/1998 | Dong-Joo | ............... H04M 1/04 224/197 |
| 6,142,435 A | 11/2000 | Lodi | |
| 6,416,248 B1 | 7/2002 | Clark | |
| 6,616,369 B2 | 9/2003 | Clark | |
| 6,955,279 B1 * | 10/2005 | Mudd | ....................... A45F 5/02 224/197 |
| 7,568,935 B1 | 8/2009 | Gonzalez et al. | |

(Continued)

*Primary Examiner* — Tan Le
(74) *Attorney, Agent, or Firm* — Lathrop GPM LLP

(57) ABSTRACT

A mount assembly has an attachment component and a housing. The housing is hollow and has an interior and an exterior. The housing has a rear plate that is substantially rectangular, a top face, a bottom face, two lateral faces, and a front plate. The front plate is substantially similar to the rear plate and has an opening that has a keyhole and a slot. The housing also has a spring biased actuator and a detent that corresponds with the keyhole and is linearly biased toward the front plate. The attachment component is configured to be releasably coupled to the housing, and has a rear wall that is substantially similar to the front plate of the housing, and a post that extends perpendicularly from the rear wall. The post has a flattened head at a distal end that corresponds to the keyhole of the front plate of the housing.

17 Claims, 8 Drawing Sheets

(56) References Cited

U.S. PATENT DOCUMENTS

| | | | |
|---|---|---|---|
| 7,980,435 B2* | 7/2011 | Tages | A45F 5/00 |
| | | | 224/269 |
| 8,020,821 B2 | 9/2011 | Chen et al. | |
| 8,282,058 B2 | 10/2012 | Lundrigan et al. | |
| 8,919,623 B1* | 12/2014 | Bergeron | A45F 5/02 |
| | | | 224/148.4 |
| 2010/0084531 A1* | 4/2010 | Schuchman | A47G 23/0225 |
| | | | 248/311.2 |

* cited by examiner

MOUNT ASSEMBLY

FIELD OF THE DISCLOSURE

The disclosure relates generally to the field of mounts. More specifically, the disclosure relates to a mount assembly having an attachment component that can be releasably coupled to a housing.

SUMMARY

The following presents a simplified summary of the disclosure in order to provide a basic understanding of some aspects of the disclosure. This summary is not an extensive overview of the disclosure. It is not intended to identify critical elements of the disclosure or to delineate the scope of the disclosure. Its sole purpose is to present some concepts of the disclosure in a simplified form as a prelude to the more detailed description that is presented elsewhere.

A mount assembly for mounting an attachment component to a housing has a hollow housing with an interior and an exterior. The housing also has a rear plate that is substantially rectangular and has four edges, a top face, a bottom face, and two lateral faces, with each face extending perpendicularly from the edges of the rear plate. A front plate is substantially similar in size to the rear plate and has at least one opening that has a keyhole and a slot. The housing also has a spring biased actuator and at least one detent that corresponds with the keyhole. The detent is linearly biased toward the front plate. The attachment component has a rear wall that is substantially similar in size to the front plate of the housing. At least one post extends at a right angle from the rear wall. The post has a distal end and a proximate end, and the distal end extends away from the rear wall. The distal end has a flattened head that corresponds to the keyhole of the front plate of the housing.

A mount assembly for mounting an attachment component to a housing has a housing with an interior and an exterior. The housing also has a rear plate, a top face and a bottom face that extend perpendicularly from the rear plate, and a front plate that is substantially similar in size to the rear plate. The front plate has at least one opening with a keyhole and a slot. The keyhole has a partially round perimeter. The housing further has a spring biased actuator with a button protruding from the bottom face of the housing and a release assembly. There is at least one detent that corresponds to the at least one keyhole. The detent is linearly biased toward the front plate. The attachment component is configured to be releasably coupled to the housing, and has a rear wall configured to interface with the front plate of the housing. There is at least one post extending at a right angle from the rear wall. The post has a distal end and a proximate end, with the distal end extending away from the rear wall. The distal end has a flattened head that corresponds to the keyhole of the front plate of the housing.

A mount assembly for mounting an attachment component to a housing has a housing with an interior and an exterior. The housing also has a rear plate, a top face and a bottom face extending perpendicularly from the rear plate, and a front plate. The front plate has a width that is within one inch of a width of the rear plate, and a height that is within one inch of a height of the rear plate. The front plate has at least one opening that has a keyhole and a slot. The keyhole has a partially round perimeter. The housing also has at least one channel. A spring biased actuator has a button protruding from the housing and a release assembly. At least one spring biased detent is behind the at least one keyhole. The detent is linearly biased toward the front plate. The attachment component is configured to be releasably coupled to the housing. The attachment component has a rear wall that is configured to interface with the front plate of the housing. At least one post extends perpendicularly from the rear wall. The post has a distal end and a proximate end, and the distal end extends away from the rear wall. The distal end has a flattened head that corresponds to the keyhole of the front plate of the housing.

BRIEF DESCRIPTION OF THE SEVERAL VIEWS OF THE DRAWINGS

Illustrative embodiments of the present disclosure are described in detail below with reference to the attached drawing figures and wherein.

DETAILED DESCRIPTION

Figure 1:
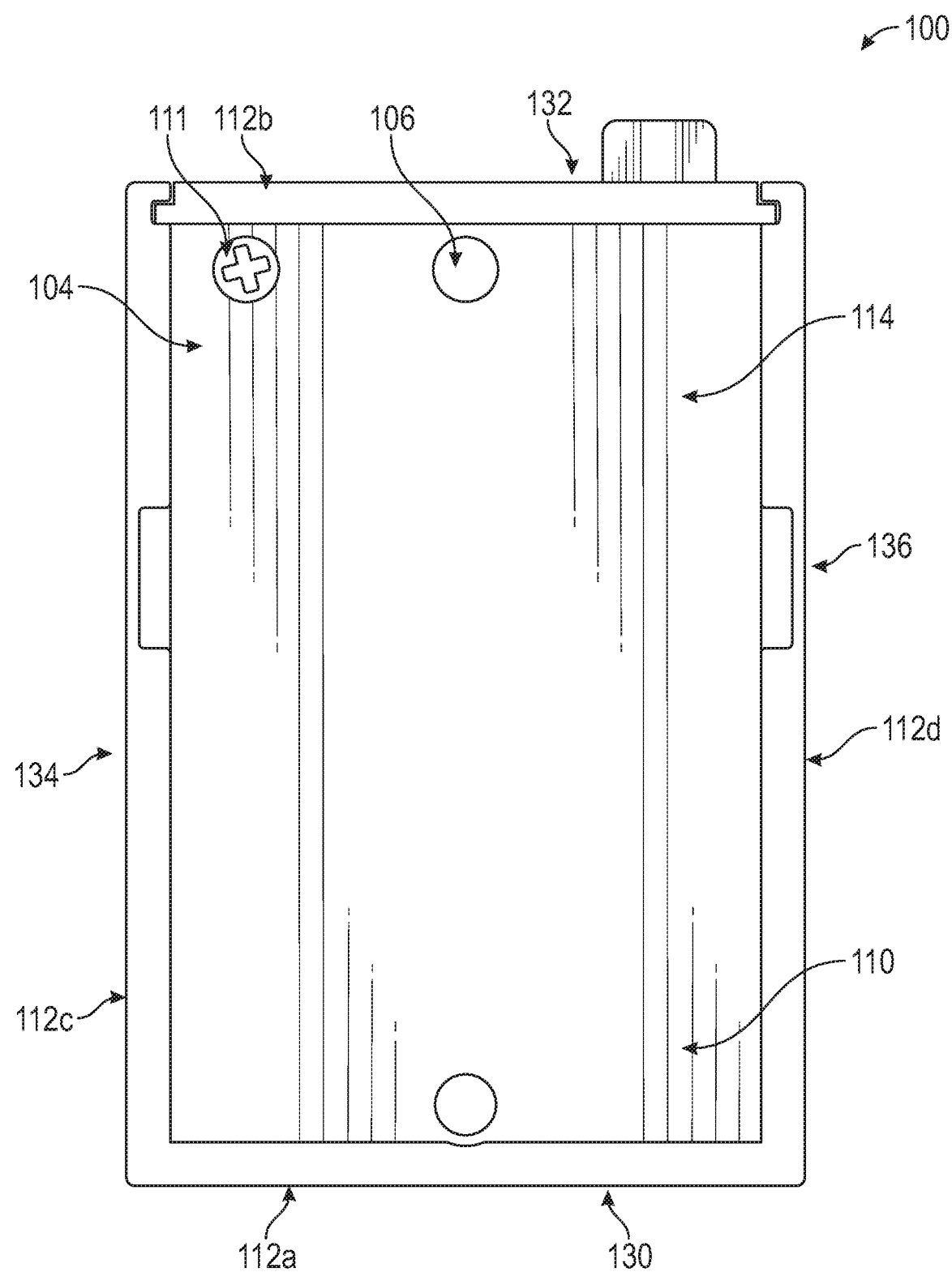
FIG. 1 is a rear view of a housing.
Figure 2:
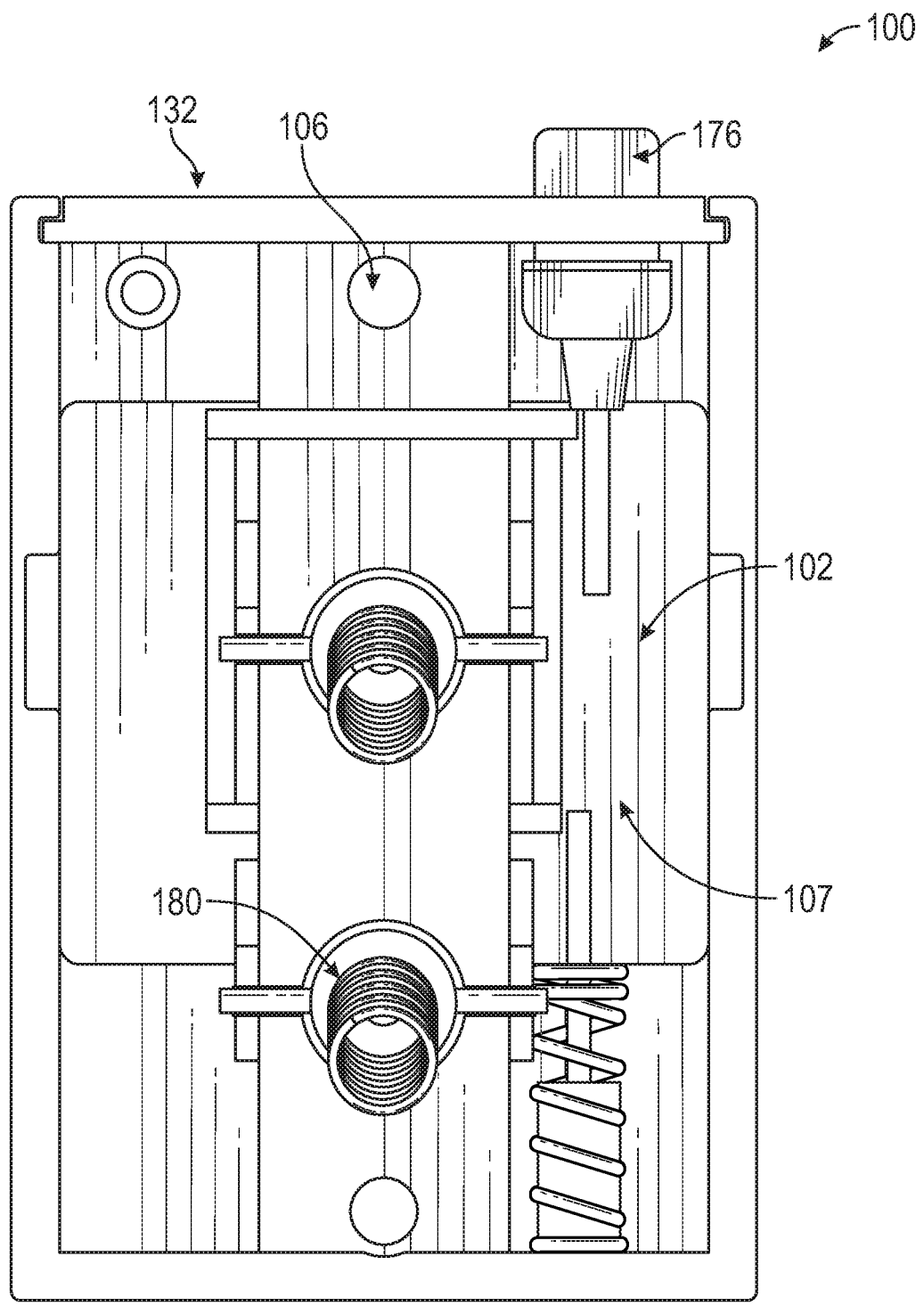
FIG. 2 is a rear view of the housing of FIG. 1 with a rear plate removed.
Figure 3:
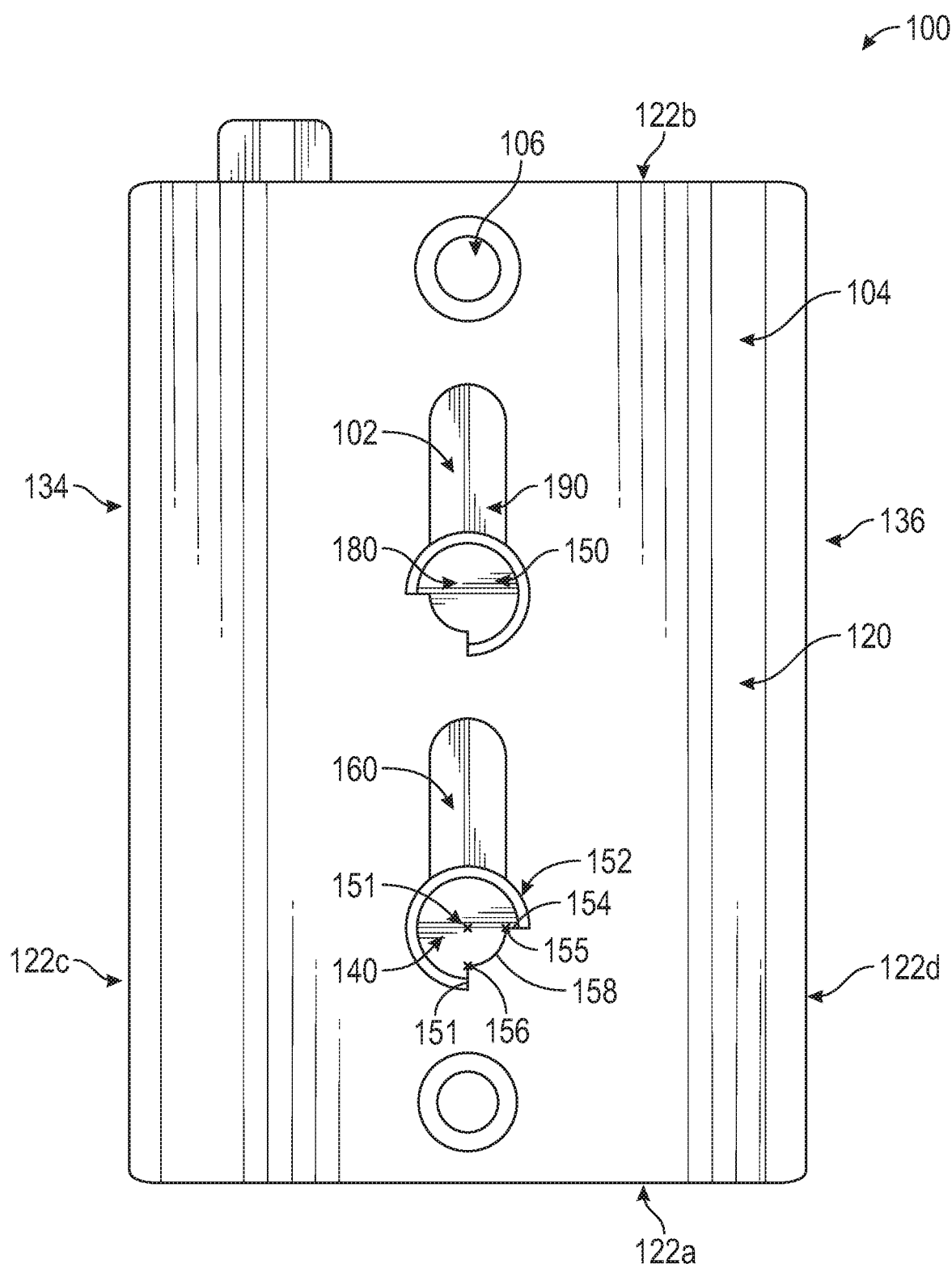
FIG. 3 is a front view of the housing of FIG. 1.
Figure 4:
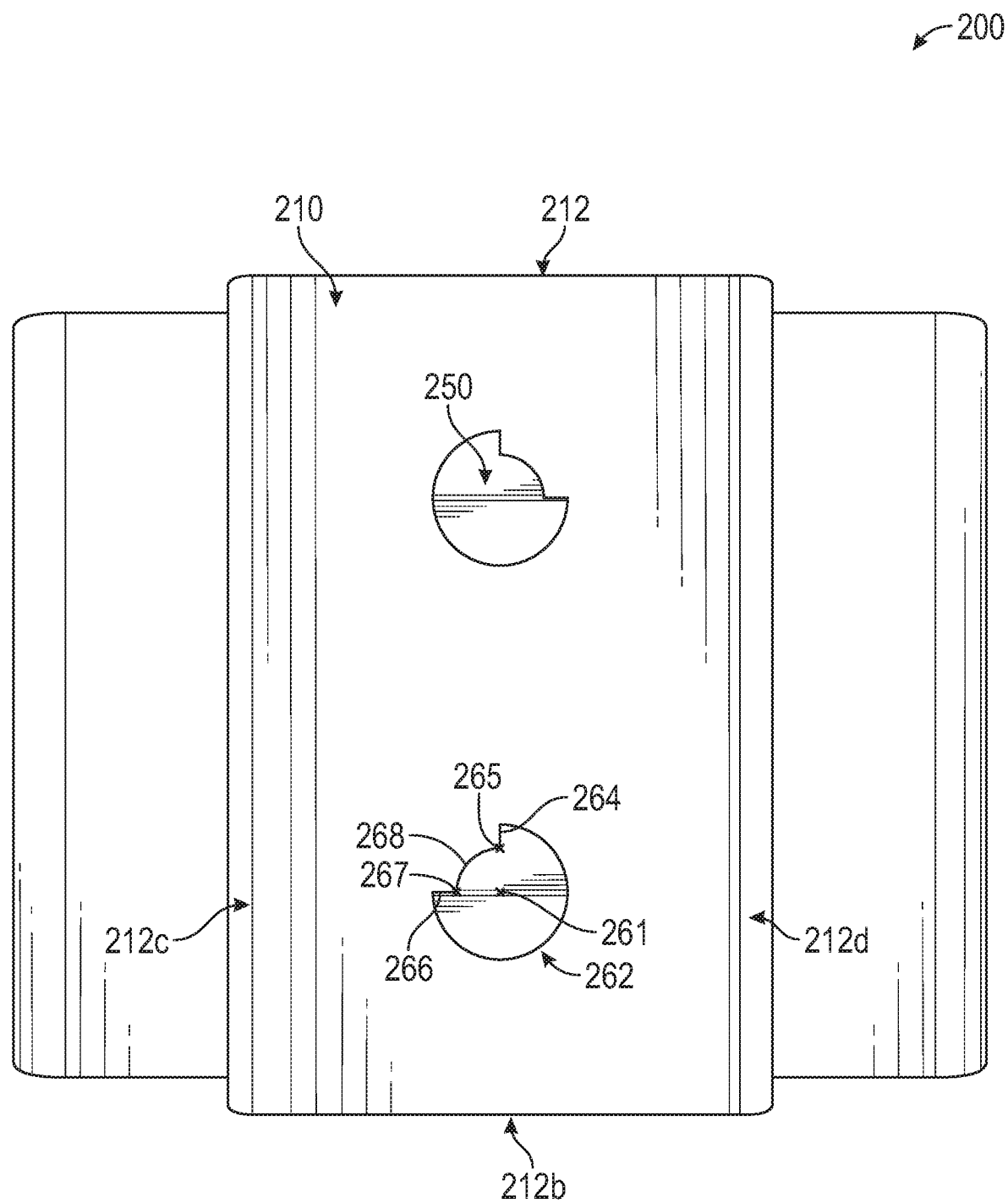
FIG. 4 is a rear view of an attachment component.
Figure 5:
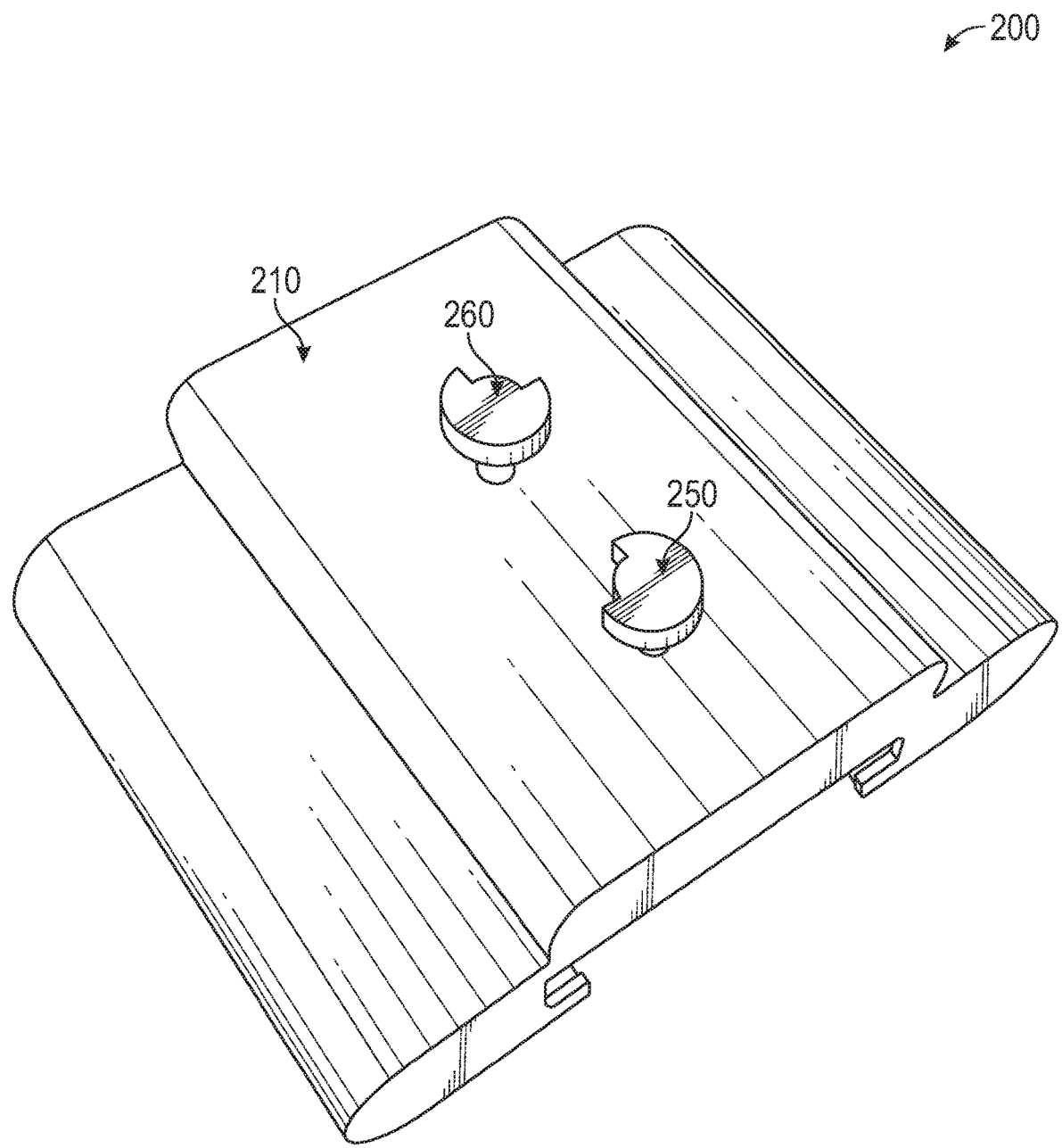
FIG. 5 is a perspective view of the attachment component of FIG. 4.
Figure 6:
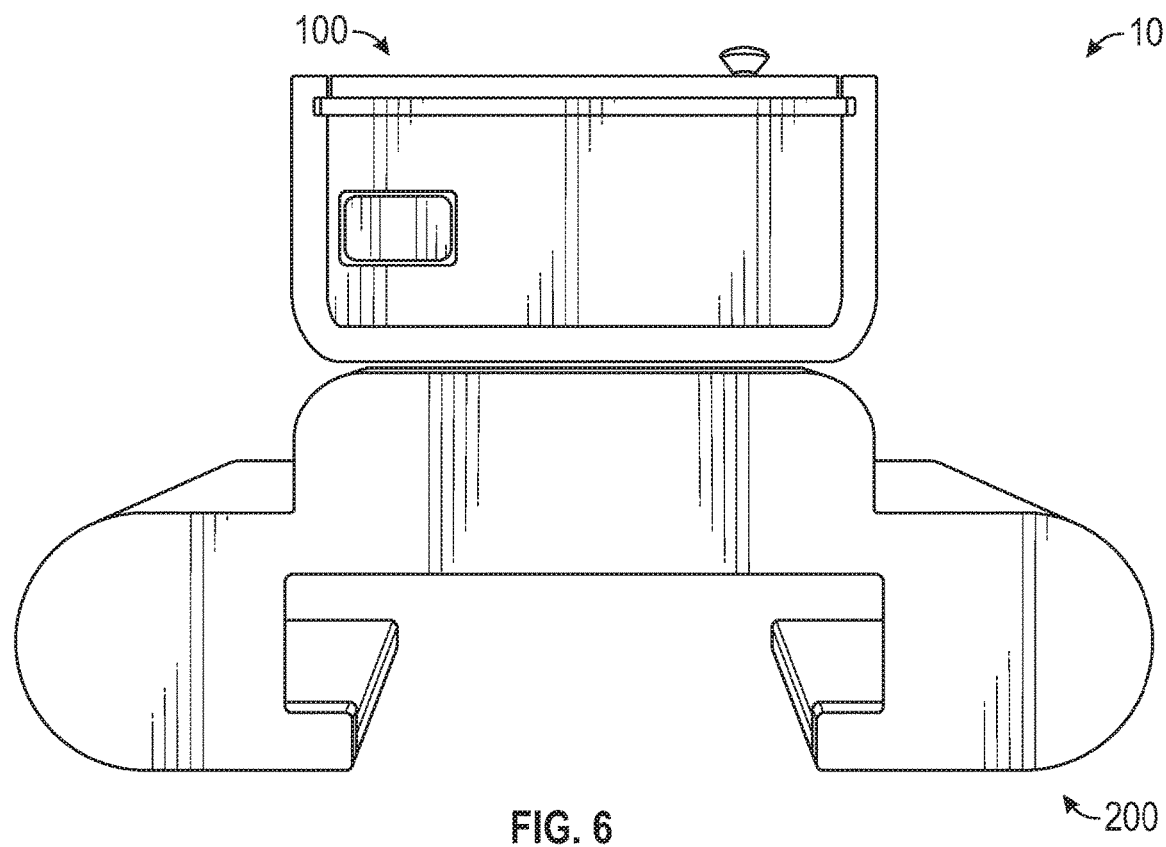
FIG. 6 is a bottom view of a mounting assembly.

In the present invention, a mount assembly 10 has a housing 100 and an attachment component 200. As shown in FIGS. 1, 2 and 3, the housing 100 has a rear plate 110, a front plate 120, an opening 140, a spring biased actuator 170, and a detent 180. As shown in FIGS. 4 and 5, the attachment component 200 has a rear wall 210, a post 250, and a flattened head 260. As shown in FIG. 6, the attachment component 200 may be releasably coupled to the housing 100. In some embodiments, the post 250 is provided with a reinforcing steel core such as a stainless steel rod or screw.

The housing 100 has an interior 102 and an exterior 104. In some embodiments, the housing 100 is hollow. The housing 100 may be configured to be coupled to a surface (not shown), which may be a support structure such as a wall, beam, cabinet, or other appropriate structure now known or later developed. The housing 100 may further have at least one aperture 106 whereby a screw, nail, or other fastener now known or later developed may pass through the aperture 106 to secure the housing 100 to the surface. In some embodiments, and as shown in FIGS. 1, 2, and 3, there are two apertures 106. The aperture 106 may pass through the rear plate 110 and the front plate 120. In some embodiments, an optional cap is provided to cover the aperture 106 when the housing is installed on a structure.

Figure 7:
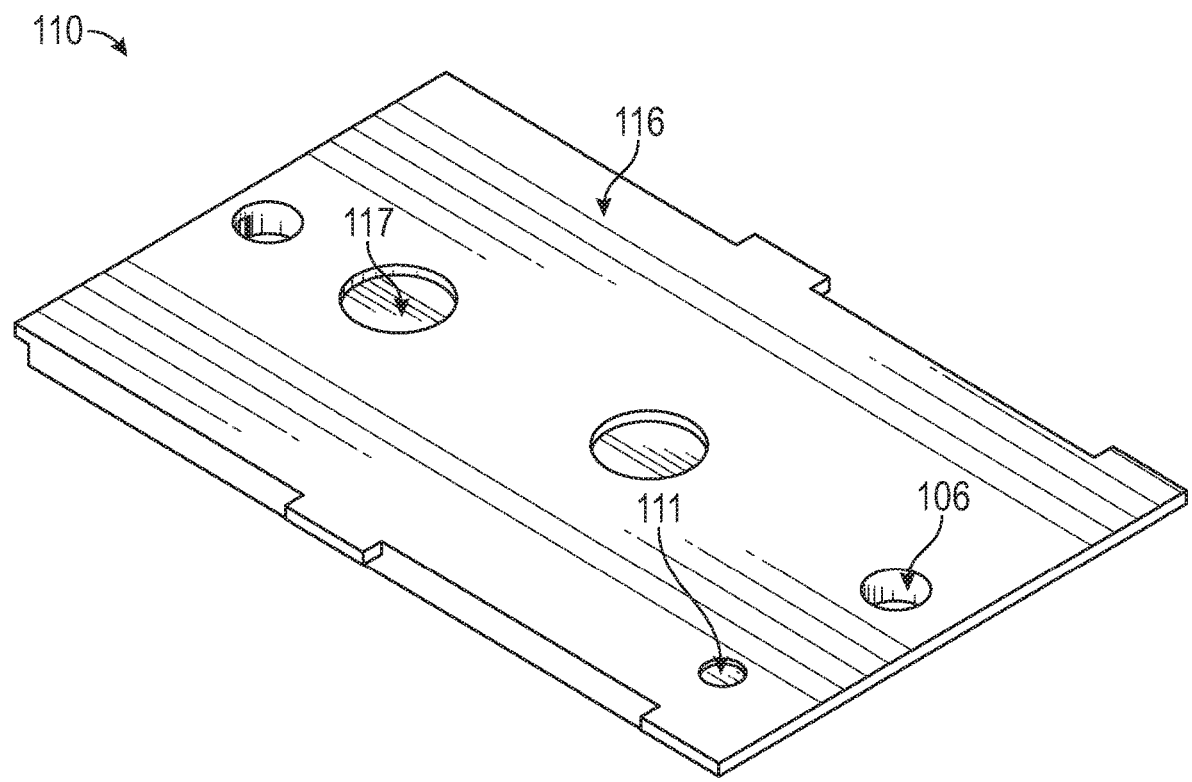
FIG. 7 is a perspective view of an interior surface of a rear plate.

As shown in FIG. 2, the rear plate 110 may be substantially rectangular and have four edges 112. In some embodiments, the rear plate 110 may be removable. The rear plate 110 may have an aperture 111 by which a screw, nail, or other fastener now known or later developed may be passed through to secure the rear plate 110 to the housing 100. Alternately, the rear plate 110 may be permanently fixed to the housing 100. In other embodiments, the rear plate 110 and the housing 100 are unitary. The rear plate 110 has an outer surface 114 and an interior surface 116 (see FIG. 7). The interior surface 116 may have at least one recess 117 that corresponds to the detent 180. In some embodiments, the number of recesses 117 corresponds to the number of detents 180. The interior surface 116 may have two recesses 117.

In some embodiments, a top face 130 may extend perpendicularly from a top edge 112a of the rear plate 110. A bottom face 132 may extend perpendicularly from a bottom edge 112b of the rear plate 110. A first lateral face 134 may extend perpendicularly from a first lateral edge 112c of the rear plate, and a second lateral face 136 may extend perpendicularly from a second lateral edge 112d of the rear plate. The top face 130, bottom face 132, first lateral face 134, and second lateral face 136 may extend from the rear plate 110 to the front plate 120. Together, the rear plate 110, top face 130, bottom face 132, first lateral face 134, second lateral face 136, and front plate 120 define the exterior 104 of the housing 100. In some embodiments, the housing 100 may have a rectangular box shape.

The front plate 120 may be substantially similar in size to the rear plate 110. In some embodiments, the front plate 120 may have a width that is within one inch of a width of the rear plate 110. Further, the front plate 120 may have a height that is within one inch of a height of the rear plate 110.

The front plate may have four edges 122: a top edge 122a, a bottom edge 122b, a first lateral edge 122c, and a second lateral edge 122d. The front plate 120 has at least one opening 140, which has a keyhole 150 and a slot 160. In some embodiments, there are two openings 140. The opening 140 may be disposed on a central axis between the first lateral edge 122c and the second lateral edge 122d of the front plate 120. In some embodiments with two openings 140, the openings 140 are both disposed on the central axis between the first lateral edge 122c and the second lateral edge 122d. Alternately, the opening 140 may be disposed at a midpoint between the first lateral face 134 and the second lateral face 136.

There may be a channel 190 proximate the opening 140 in the interior 102 of the housing 100. In some embodiments, there may be more than one channel 190. The number of channels 190 may correspond to the number of detents 180.

The keyhole 150 may have a substantially similar shape and size to the flattened head 260. In some embodiments the keyhole 150 has a partially round perimeter. The keyhole 150 may have a reflexive circular sector shape having a circular perimeter 152, a first edge 154, and a second edge 156. The edges 154, 156 may be radial arms extending from a center point 151 of the keyhole 150. The keyhole 150 may further have an arc 158 extending from the first edge 154 to the second edge 156. In some embodiments, the arc 158 extends from approximately a midpoint 155 of the first edge 154 to approximately a midpoint 157 of the second edge 156. The keyhole 150 may have a reflexive circular sector shape between 230 and 300 degrees.

In some embodiments, the housing 100 has two openings 140. Each opening 140 has a keyhole 150 and a slot 160. The openings 140 may be positioned along a central vertical axis of the housing 100. As shown in FIG. 3, the keyholes 150 may be rotated approximately 90 degrees relative one another. This may prevent slippage of the attachment component 200 when the attachment component 200 is coupled to the housing 100.

In some embodiments, the first edge 154 is substantially parallel to the first lateral edge 122c and the second lateral edge 122d. Alternately, the second edge 156 may be substantially parallel to the first lateral edge 122c and the second lateral edge 122d. In some embodiments, the first edge 154 is substantially parallel to the top edge 122a and the bottom edge 122b. Alternately, the second edge 156 may be substantially parallel to the top edge 122a and the bottom edge 122b.

In some embodiments, a length of the slot 160 is substantially similar to a diameter of the keyhole 150. A width of the slot 160 may be less than four millimeters larger than a diameter of the post 250.

Figure 8:
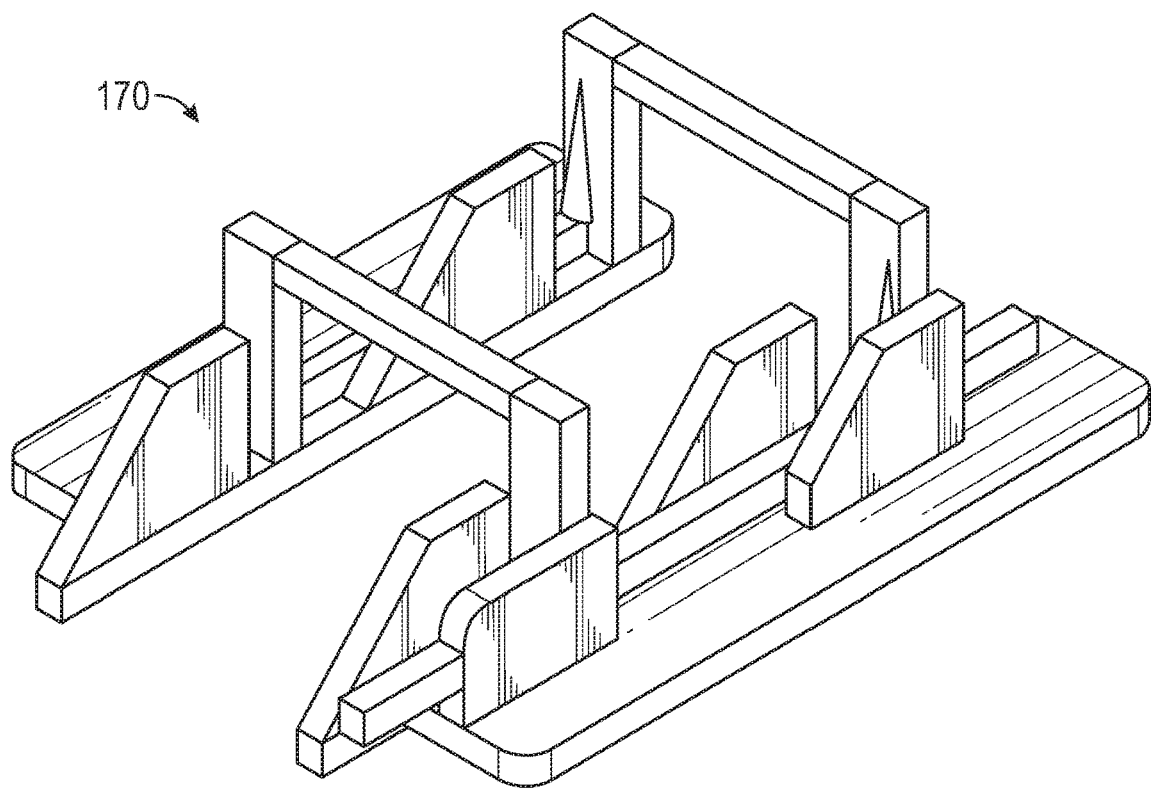
FIG. 8 is a perspective view of a release assembly.

As shown in FIG. 2, the housing 100 has a spring biased actuator 170 having a release assembly 174 (see FIG. 8) and a button 176. The button 176 may protrude from an aperture (not shown) in the bottom face 132 of the housing 100. When the spring biased actuator 170 is actuated, the detent 180 may recess toward the rear plate 110 and allow access to the channel 190. Alternately, the channel 190 may be accessed by pushing on the detent 180.

The interior 102 of the housing 100 has at least one detent 180. In some embodiments, the detent 180 may be spring biased (springs shown in FIG. 3). The detent 180 corresponds with the keyhole 150 and may be linearly biased toward the front plate 120. The number of detents 180 may correspond to the number of keyholes 150.

Figure 10:
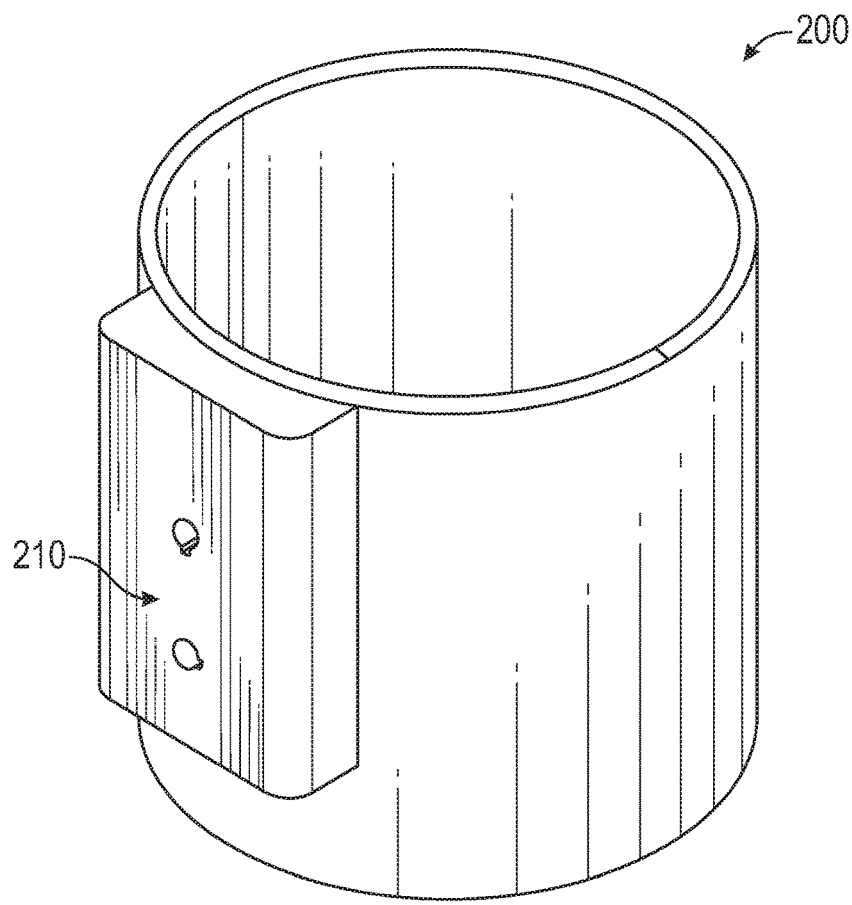
FIG. 10 is a perspective view of an attachment component.

The attachment component 200 is configured to be releasably coupled to the housing 100. The detent 180 may be used to secure the attachment component 200 to the housing 100 when the housing 100 is coupled to the attachment component 200. The attachment component 200 may further include a receptacle for hand-held electronic devices. In some embodiments, the attachment component 200 may include a cup holder, desk, TV tray, receptacle, or other appropriate device now known or later discovered. The attachment component 200 is shown in connection with a cup holder in FIG. 10.

The rear wall 210 of the attachment component 200 may be substantially similar in size to the front plate 120 of the housing 100. As shown in FIG. 4, in some embodiments the rear wall 210 is substantially rectangular with four edges 212: a top edge 212a, a bottom edge 212b, a first lateral edge 212c, and a rear lateral edge 212d. The rear wall 210 may be configured to interface with the front plate 120 of the housing 100.

Figure 9:
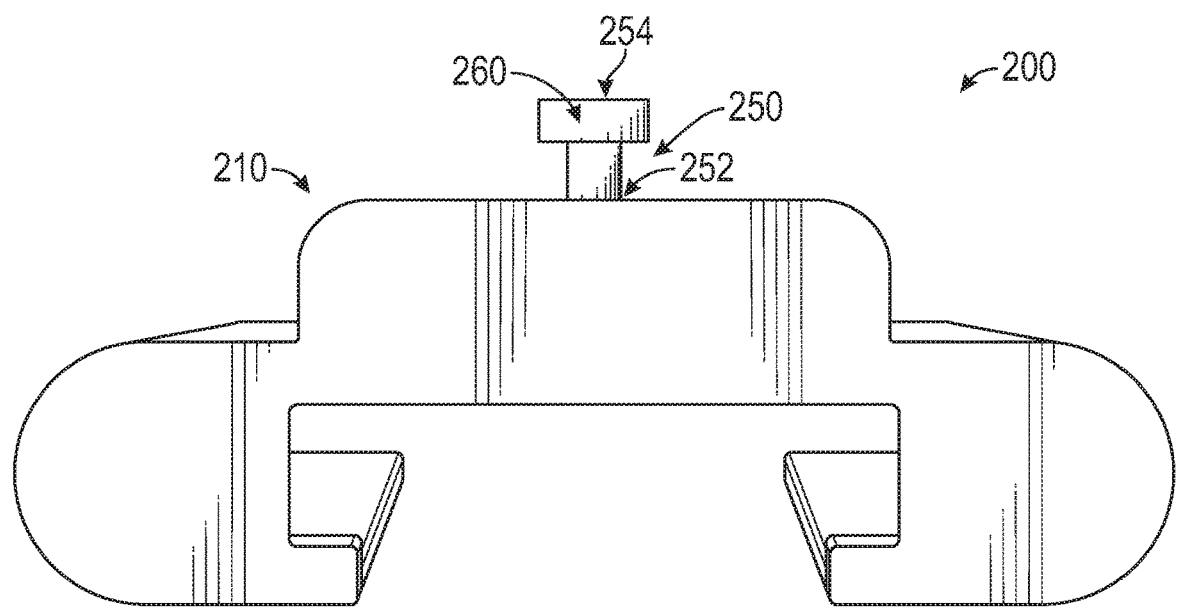
FIG. 9 is a bottom view of the attachment component of FIG. 4.

As shown in FIG. 9, at least one post 250 extends from the rear wall 210. The post 250 may extend at a right angle from the rear wall 210. The post 250 has a proximate end 252 and a distal end 254. There is a flattened head 260 at the distal end 254, and the flattened head 260 may correspond to a shape and size of the keyhole 150 of the front plate 120. The post 250 may be disposed on a central axis between the first lateral edge 212c and the second lateral edge 212d of the rear wall 210.

In some embodiments with two posts 250, the posts 250 are both disposed on the central axis between the first lateral edge 212c and the second lateral edge 212d. The flattened heads 260 may be rotated approximately 90 degrees one another. This may prevent slippage of the attachment component 200 when it is coupled to the housing 100.

As shown in FIG. 4, the flattened head 260 may have a reflexive circular sector shape having a circular perimeter 262, a first edge 264, and a second edge 266. The edges 264, 266 may be radial arms extending from a center point 261 of the flattened head 260. The flattened head 260 may further have an arc 268 extending from the first edge 264 to the second edge 266. In some embodiments, the arc 268 extends from approximately a midpoint 265 of the first edge 264 to approximately a midpoint 267 of the second edge 266. The flattened head 260 may have a reflexive circular sector shape between 230 and 300 degrees.

In use, the attachment component 200 is releasably coupled to the housing 100. The keyhole 150 may be matched up with the flattened head 260 of the post 250. The post 250 may be inserted into the keyhole 150, thereby pushing the detent 180 toward the rear plate 110. The post 250 may then slide into the channel 190. Once the flattened head 260 is clear of the detent 180, the detent 180 may then return to a normal position. The flattened head 260 is thereby secured within the channel 190, and the attachment component 200 is temporarily secured to the housing 100.

Figure 11:
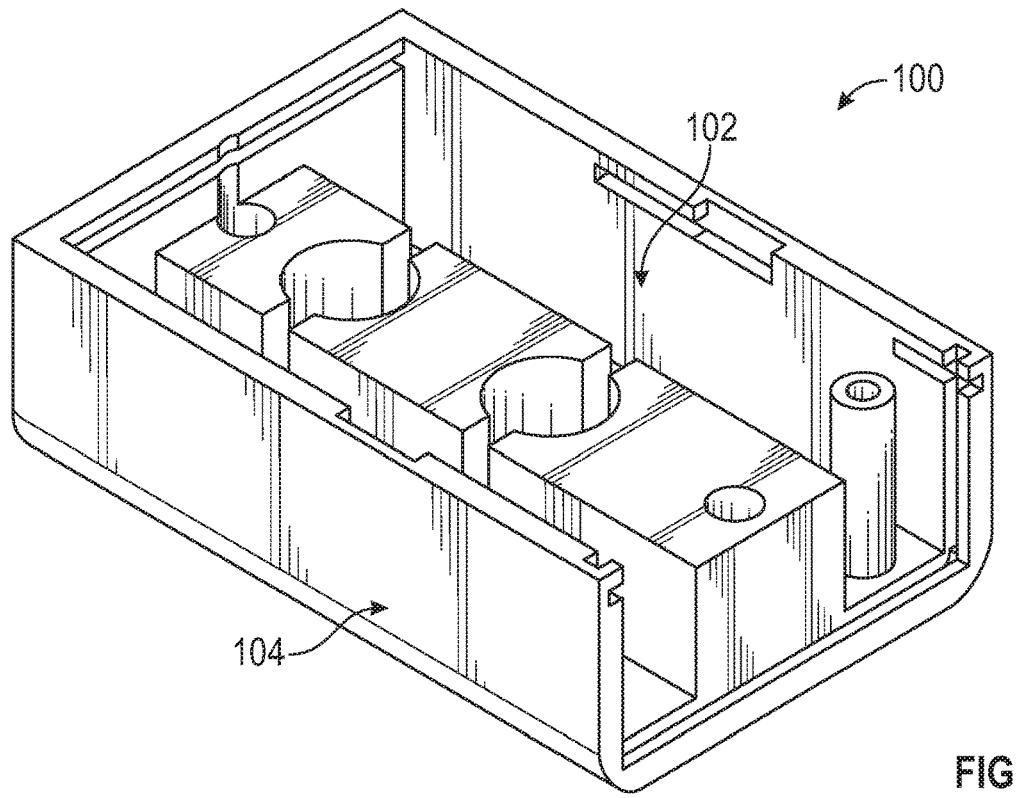
FIG. 11 is a perspective view of the interior of the housing of FIG. 1.

The attachment component 200 may be released from the housing 100 when the button 176 is engaged, thereby actuating the springs in the spring biased actuator 170. The release assembly 174 is moved as the springs are actuated, and, in connection with the interior of the housing (see FIG. 11), the detent 180 is recessed such that the flattened head 260 can exit the channel 190 and move directly in front of the detent 180. The attachment component 200 may then uncouple from the housing 100 and the flattened head 260 may exit the interior 102 of the housing 100 through the keyhole 150.

Many different arrangements of the various components depicted, as well as components not shown, are possible without departing from the spirit and scope of the present disclosure. Embodiments of the present disclosure have been described with the intent to be illustrative rather than restrictive. Alternative embodiments will become apparent to those skilled in the art that do not depart from its scope. A skilled artisan may develop alternative means of implementing the aforementioned improvements without departing from the scope of the present disclosure.

It will be understood that certain features and subcombinations are of utility and may be employed without reference to other features and subcombinations and are contemplated within the scope of the claims. Not all steps listed in the various figures need be carried out in the specific order described.

The disclosure claimed is:

1. A mount assembly for mounting an attachment component to a housing, the mount assembly comprising:
    a hollow housing having an interior and an exterior, the housing further comprising:
        a rear plate being substantially rectangular and having four edges;
        a top face, a bottom face, and two lateral faces, each face extending perpendicularly from the edges of the rear plate;
        a front plate being substantially similar in size to the rear plate and having at least one opening having a keyhole and a slot;
        a spring biased actuator; and
        at least one detent that corresponds with the keyhole being linearly biased toward the front plate; and
    an attachment component configured to be releasably coupled to the housing, the attachment component further comprising:
        a rear wall being substantially similar in size to the front plate of the housing; and
        at least one post extending at a right angle from the rear wall, the post having a distal end and a proximate end, the distal end extending away from the rear wall and having a flattened head that corresponds to the keyhole of the front plate;
    wherein the keyhole has a reflexive circular sector shape having a circular perimeter, a first edge, and a second edge.

2. The mount assembly of claim 1, wherein the keyhole further has an arc extending from the first edge to the second edge.

3. The mount assembly of claim 1, wherein a length of the slot is substantially similar to a diameter of the keyhole.

4. The mount assembly of claim 1, wherein the housing has at least one aperture.

5. The mount assembly of claim 1, wherein the slot has a width of less than 4 millimeters larger than a diameter of the post.

6. The mount assembly of claim 1, wherein the opening is disposed on a central axis between the two lateral faces.

7. The mount assembly of claim 1, wherein the first edge of the sector is substantially parallel the two lateral sides.

8. A mount assembly for mounting an attachment component to a housing, the mount assembly comprising:
    a housing having an interior and an exterior, the housing further comprising:
        a rear plate;
        a top face and a bottom face extending perpendicularly from the rear plate;
        a front plate being substantially similar in size to the rear plate and having at least one opening having a keyhole and a slot, the keyhole having a partially round perimeter;
        a spring biased actuator having a button protruding from the bottom face of the housing and a release assembly;
        at least one detent that corresponds with the at least one keyhole being linearly biased toward the front plate; and
    an attachment component configured to be releasably coupled to the housing, the attachment component further comprising:
        a rear wall configured to interface with the front plate of the housing; and
        at least one post extending at a right angle from the rear wall, the post having a distal end and a proximate end, the distal end extending away from the rear wall and having a flattened head that corresponds to the keyhole of the front plate;
    wherein the flattened head is a reflexive circular sector shape having a perimeter, a first radial edge, and a second radial edge, the flattened head further having an arc extending from approximately a midpoint of the first radial edge to approximately a midpoint of the second radial edge.

9. The mount assembly of claim 8, wherein the housing further comprises an aperture whereby the housing may be secured to a support structure.

10. The mount assembly of claim 8, wherein the at least one post is on a central axis between two lateral sides of the rear plate.

11. The mount assembly of claim 10, wherein the rear wall is substantially similar in size to the front plate.

12. The mount assembly of claim 8, wherein the at least one detent secures the attachment component to the housing when the housing is coupled to the attachment component.

13. The mount assembly of claim 8, wherein the housing has at least one channel proximate the opening.

14. The mount assembly of claim 8, wherein the flattened head is a reflexive circular sector between 230 and 300 degrees.

15. The mount assembly of claim 8, wherein the attachment component further comprises a receptacle for handheld electronic devices.

16. A mount assembly for mounting an attachment component to a housing, the mount assembly comprising:
- a housing having an interior and an exterior, the housing further comprising:
  - a rear plate;
  - a top face and a bottom face extending perpendicularly from the rear plate;
  - a front plate having a width that is within one inch of a width of the rear plate and a height that is within one inch of a height of the rear plate, the front plate further having at least one opening having a keyhole and a slot, the keyhole having a partially round perimeter;
  - at least one channel;
  - a spring biased actuator having a button protruding from the housing and a release assembly;
  - at least one spring biased detent behind the at least one keyhole being linearly biased toward the front plate; and
- an attachment component configured to be releasably coupled to the housing, the attachment component comprising:
  - a rear wall configured to interface with the front plate of the housing; and
  - at least one post extending perpendicularly from the rear wall, the post having a distal end and a proximate end, the distal end extending away from the rear wall and having a flattened head that corresponds to the keyhole of the front plate;
- wherein the keyhole is a reflexive circular sector shape defined by a perimeter, a first radial edge, and a second radial edge, the keyhole further defined by an arc extending from approximately a midpoint of the first radial edge to approximately a midpoint of the second radial edge.

17. The mount assembly of claim 16, wherein there are two openings, each opening having a keyhole positioned along a central axis of the housing, wherein the keyholes are rotated approximately 90 degrees relative one another.

* * * * *